United States Patent
Kvarnström et al.

(10) Patent No.: US 12,312,492 B2
(45) Date of Patent: *May 27, 2025

(54) METHOD FOR PRODUCING A POLYMER FILM

(71) Applicant: Turun Yliopisto, Turun yliopisto (FI)

(72) Inventors: Carita Kvarnström, Turku (FI); Pia Damlin, Littoinen (FI); Mikko Salomäki, Masku (FI); Mauri Nauma, Masku (FI); Rahul Balu Yewale, Turunyliopisto (FI)

(73) Assignee: TURUN YLIOPISTO, Turun Yliopisto (FI)

( * ) Notice: Subject to any disclaimer, the term of this patent is extended or adjusted under 35 U.S.C. 154(b) by 240 days.

This patent is subject to a terminal disclaimer.

(21) Appl. No.: 17/053,029

(22) PCT Filed: May 2, 2019

(86) PCT No.: PCT/FI2019/000006
§ 371 (c)(1),
(2) Date: Nov. 4, 2020

(87) PCT Pub. No.: WO2019/211510
PCT Pub. Date: Nov. 7, 2019

(65) Prior Publication Data
US 2021/0230450 A1    Jul. 29, 2021

(30) Foreign Application Priority Data

May 4, 2018 (WO) .................. PCT/FI2018/050330

(51) Int. Cl.
*C09D 181/02* (2006.01)
*B05D 1/00* (2006.01)
(Continued)

(52) U.S. Cl.
CPC .......... *C09D 181/02* (2013.01); *B05D 1/005* (2013.01); *B05D 1/60* (2013.01); *B05D 3/101* (2013.01);
(Continued)

(58) Field of Classification Search
CPC . C09D 181/02; C09D 7/63; C09D 5/24; C08J 7/0427; C08J 5/18; C08J 7/16;
(Continued)

(56) References Cited

U.S. PATENT DOCUMENTS

2007/0196643 A1    8/2007 Park
2011/0315204 A1   12/2011 Gleason
2014/0272342 A1    9/2014 Bernier et al.

FOREIGN PATENT DOCUMENTS

EP    2123731 A1    11/2009
JP    2010533219 A  10/2010
(Continued)

OTHER PUBLICATIONS

International Search Report dated Aug. 1, 2019 for corresponding International Application No. PCT/FI2019/000006.
(Continued)

*Primary Examiner* — Shane Fang
(74) *Attorney, Agent, or Firm* — TAROLLI, SUNDHEIM, COVELL & TUMMINO L.L.P.

(57) ABSTRACT

A method for producing a PEDOT film on a substrate comprising a substrate and at least one PEDOT layer on a surface of the substrate is disclosed. The method comprises applying a solution comprising an oxidant and a base inhibitor on a surface of the substrate; subjecting the oxidant-coated substrate to a polymerization step by exposing the surface (s) of the oxidant-coated substrate to EDOT monomer vapour at a polymerization temperature; and wherein, during the polymerization step, the temperature of
(Continued)

the oxidant-coated substrate is kept at a controlled substrate temperature and wherein the controlled substrate temperature is 2-40° C. lower than the polymerization temperature. Further is disclosed a conducting PEDOT film, an electronic device comprising the conducting PEDOT film and different uses of the conducting PEDOT film. Further, is disclosed a method for producing a polymer film formed of a copolymer, a conducting polymer film, an electronic device comprising the conducting polymer film and different uses of the conducting polymer film.

24 Claims, 5 Drawing Sheets

(51) Int. Cl.
  *B05D 3/10* (2006.01)
  *C08G 61/12* (2006.01)
  *C08J 5/18* (2006.01)
  *C08J 7/04* (2020.01)
  *C08J 7/16* (2006.01)
  *C09D 5/24* (2006.01)
  *C09D 7/63* (2018.01)
  *H01B 1/12* (2006.01)
(52) U.S. Cl.
  CPC ............. *B05D 3/104* (2013.01); *B05D 3/108* (2013.01); *C08G 61/126* (2013.01); *C08J 5/18* (2013.01); *C08J 7/0427* (2020.01); *C08J 7/16* (2013.01); *C09D 5/24* (2013.01); *C09D 7/63* (2018.01); *H01B 1/127* (2013.01); *B05D 2201/02* (2013.01); *B05D 2203/35* (2013.01); *B05D 2518/00* (2013.01); *C08G 2261/3247* (2013.01); *C08G 2261/43* (2013.01); *C08G 2261/91* (2013.01); *C08G 2261/94* (2013.01); *C08G 2261/95* (2013.01)
(58) Field of Classification Search
  CPC .......... B05D 1/005; B05D 1/60; B05D 3/101; B05D 3/104; B05D 3/108; B05D 2201/02; B05D 2203/35; B05D 2518/00; C08G 61/126; C08G 2261/3247; C08G 2261/43; C08G 2261/91; C08G 2261/94; C08G 2261/09; H01B 1/127
  See application file for complete search history.

(56) References Cited

FOREIGN PATENT DOCUMENTS

| WO | 2009007361 A1 | 1/2009 |
| WO | 2012121417 A1 | 9/2012 |
| WO | 2013052993 A1 | 4/2013 |

OTHER PUBLICATIONS

R.B. Yewale et al. "Vapor phase polymerized highly conducting PEDOT films as electrode and high capacitance material", 11th Annual Matsurf Seminar, Nov. 6, 2017, XP055539895, Finland.

Kim, Jin-Yeol, et al. "Highly conductive and transparent poly (3, 4-ethylenedioxythiophene): p-toluene sulfonate films as a flexible organic electrode." Japanese Journal of Applied Physics vol. 48, No. 9 (2009): p. 91501.

Fabretto, Manrico, et al. "The role of water in the synthesis and performance of vapour phase polymerised PEDOT electrochromic devices." Journal of Materials Chemistry vol. 19, No. 42 (2009): pp. 7871-7878.

Winther-Jensen, Bjørn, et al. "Base inhibited oxidative polymerization of 3, 4-ethylenedioxythiophene with iron (III) tosylate." Synthetic metals vol. 152, No. 1-3 (2005): pp. 1-4.

Fabretto, Manrico, et al. "Vacuum vapour phase polymerised poly (3, 4-ethyelendioxythiophene) thin films for use in large-scale electrochromic devices." Thin solid films vol. 519, No. 8 (2010): pp. 2544-2549.

Fabretto, Manrico, et al. "In-situ QCM-D analysis reveals four distinct stages during vapour phase polymerisation of PEDOT thin films." Polymer vol. 51, No. 8 (2010): pp. 1737-1743.

Im, Sung Gap, et al. "Doping level and work function control in oxidative chemical vapor deposited poly (3, 4-ethylenedioxythiophene)." Applied Physics Letters vol. 90, No. 15 (2007): pp. 152112.

Fabretto, Manrico V., et al. "Polymeric material with metal-like conductivity for next generation organic electronic devices." Chemistry of Materials vol. 24, No. 20 (2012): pp. 3998-4003.

Lee, Sunghwan, et al. "Enhanced optical property with tunable band gap of cross-linked PEDOT Copolymers via oxidative chemical vapor deposition." Advanced Functional Materials vol. 25, No. 1 (2015): pp. 85-93.

Kim, Jinyeol, et al. "The preparation and characteristics of conductive poly (3, 4 ethylenedioxythiophene) thin film by vapor-phase polymerization." Synthetic metals 139.2 (2003): pp. 485-489.

Search Report dated Aug. 19, 2021 for corresponding U.S. Appl. No. 17/052,638.

A. V. Kukhta; Optical and Electrophysical Properties of Nanocomposites Based on PEDOT : PSS and Gold/Silver Nanoparticles; ISSN 1063-7834, Physics of the Solid State, 2014, vol. 56, No. 4, pp. 827-834. © Pleiades Publishing, Ltd., 2014. Original Russian Text © A.V. Kukhta, A.E. Pochtenny, A.V. Misevich, I.N. Kukhta, E.M. Semenova, S.A. Vorobyova, E. Sarantopoulou, 2014, published in Fizika Tverdogo Tela, 2014, vol. 56, No. 4, pp. 794-801.

Sbjørn Winther-Jensen, Frederik C. Krebs Solar Energy Materials & Solar Cells 90 (2006) 123-132 High-conductivity large-area semi-transparent electrodes for polymer photovoltaics by silk screen printing and vapour-phase deposition.

Korean Office Action dated Jul. 22, 2024 for Korean Application No. 10-2020-7034184.

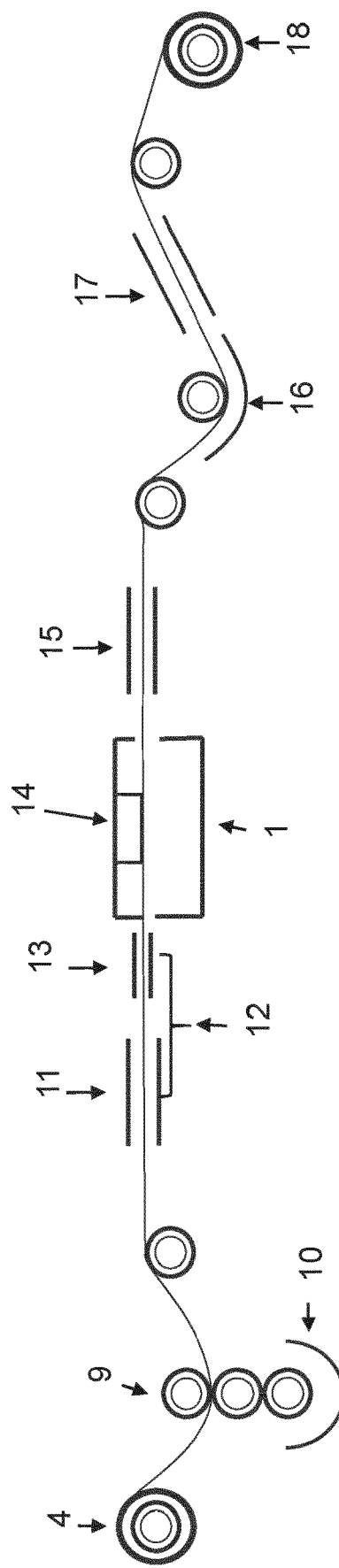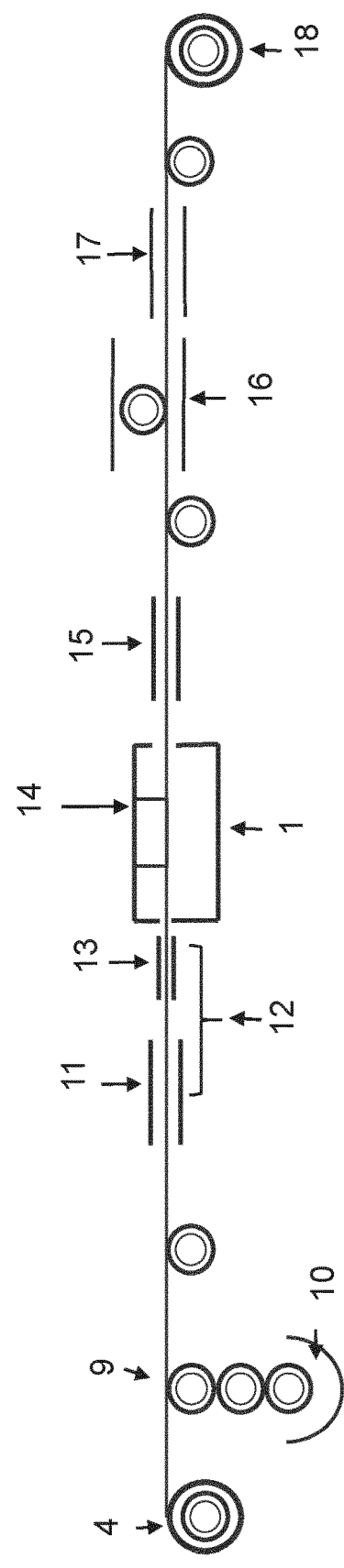

METHOD FOR PRODUCING A POLYMER FILM

RELATED APPLICATIONS

The present application is a U.S. National Stage application under 35 USC 371 of PCT Application Serial No. PCT/FI2019/000006, filed on 2 May 2019, claiming priority to PCT Application Serial No. PCT/FI2018/050330, filed on 4 May 2018, the entirety of each of which are incorporated herein by reference.

TECHNICAL FIELD

The present disclosure relates to a method for producing a poly (3,4-ethylenedioxythiophene) (PEDOT) film. The present disclosure further relates to a conductive PEDOT film. The present disclosure further relates to an electronic device comprising the conductive PEDOT film and the use of the conducting PEDOT film as an antistatic coating or an electrode in/of an electronic device. The present disclosure also relates to a method for producing a polymer film formed of copolymer, an electronic device comprising the conductive polymer film and the use of the conducting polymer film as an antistatic coating or an electrode in/of an electronic device.

BACKGROUND

Conducting PEDOT films and it's copolymer films are used in different fields like antistatic coatings, perovskite solar cells, organic solar cells, dye-sensitized solar cells, electrochemical transducers, electrochromic devices, electroluminescent devices, thermoelectric devices, smart windows, OLED's, optoelectronics and supercapacitors. Conducting PEDOT films may be manufactured by e.g. electrochemical polymerization of PEDOT on conducting substrate, oxidative chemical vapor deposition (oCVD) or vacuum vapor phase polymerization (VVPP) technique. When forming a conductive PEDOT film for electronic devices, their conductivity, low sheet resistance, morphology (roughness average) and optical transparency is of importance.

SUMMARY

A method for producing a poly (3,4-ethylenedioxythiophene) (PEDOT) film on a substrate comprising a substrate and at least one PEDOT layer on at least one surface of the substrate is disclosed. The method may comprise: applying a solution comprising an oxidant and a base inhibitor on at least one surface of the substrate so as to form an oxidant coating on at least one surface of the substrate; subjecting the oxidant-coated substrate formed to a polymerization step by exposing the surface(s) of the oxidant-coated substrate to 3,4-ethylenedioxythiophene (EDOT) monomer vapour at a polymerization temperature to form a PEDOT layer on the surface(s) of the oxidant-coated substrate; and wherein, during the polymerization step, the temperature of the oxidant-coated substrate is kept at a controlled substrate temperature and wherein the controlled substrate temperature is 2-40° C. lower than the polymerization temperature.

A method for producing a polymer film formed of a copolymer wherein one of the monomer of the copolymer is (3,4-ethylenedioxythiophene) (EDOT) on a substrate comprising a substrate and at least one polymer layer on at least one surface of the substrate is disclosed. The method may comprise: applying a solution comprising an oxidant and a base inhibitor on at least one surface of the substrate so as to form an oxidant coating on at least one surface of the substrate; subjecting the oxidant-coated substrate formed to a polymerization step by exposing the surface(s) of the oxidant-coated substrate to by exposing the surface(s) of the oxidant-coated substrate to vapour of at least two monomers, wherein one of the monomers is EDOT monomer at a polymerization temperature to form a polymer layer on the surface(s) of the oxidant-coated substrate; and wherein, during the polymerization step, the temperature of the oxidant-coated substrate is kept at a controlled substrate temperature and wherein the controlled substrate temperature is 2-40° C. lower than the polymerization temperature.

Further, a conducting PEDOT film is disclosed. The conducting PEDOT film may comprise a non-conductive substrate; a PEDOT layer having anions from an oxidant/oxidants embedded in the PEDOT layer on the non-conductive substrate, wherein the conducting PEDOT film has conductivity of over 2100 S/cm and sheet resistance of below 200Ω/□.

Further, a conducting PEDOT film which is obtainable by the method for producing a PEDOT film comprising a non-conductive substrate and at least one PEDOT layer on at least one surface of the non-conductive substrate as disclosed in the present disclosure is disclosed.

Further, a conducting polymer film formed of a copolymer wherein one of the monomers of the copolymer is (3,4-ethylenedioxythiophene) (EDOT) is disclosed. The conducting polymer film may comprise a non-conductive substrate; a polymer layer film formed of a copolymer having anions from an oxidant/oxidants embedded in the polymer layer on the non-conductive substrate, wherein the thickness of the conducting polymer film is 10-500 nm or 10-200 nm.

Further, a conducting polymer film formed of a copolymer wherein one of the monomers of the copolymer is (3,4-ethylenedioxythiophene) (EDOT) which is obtainable by the method for producing a polymer film comprising a non-conductive substrate and at least one polymer layer on at least one surface of the non-conductive substrate as disclosed in the present disclosure is disclosed.

Further, an electronic device is disclosed. The electronic device may comprise the conducting PEDOT film or the conducting polymer film formed of a copolymer wherein one of the monomers of the copolymer is EDOT as disclosed in the present disclosure.

Further, uses of the conducting PEDOT film and the conducting polymer film formed of a copolymer wherein one of the monomers of the copolymer is EDOT are disclosed.

BRIEF DESCRIPTION OF THE DRAWINGS

The accompanying drawings, which are included to provide a further understanding of the embodiments and constitute a part of this specification, illustrate various embodiments. In the drawings:

FIG. 6 illustrates a continuous set up for carrying out continuous vapour phase polymerization for flexible substrates.

FIG. 7 illustrates a continuous set up for carrying out continuous vapour phase polymerization for rigid substrates.

DETAILED DESCRIPTION

Figure 1:
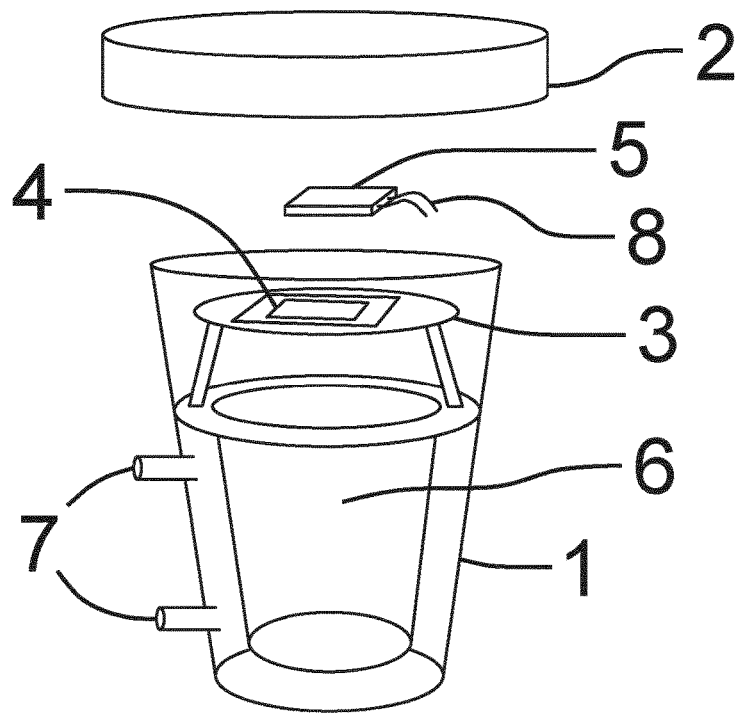
FIG. 1 illustrates the vapor phase polymerization cell for carrying out the vapour phase polymerization.

The present application relates to a method for producing a poly (3,4-ethylenedioxythiophene) (PEDOT) film comprising a substrate and at least one PEDOT layer on at least one surface of the substrate, wherein the method comprises the steps of:
- a) applying a solution comprising an oxidant and a base inhibitor on at least one surface of the substrate so as to form an oxidant coating on at least one surface of the substrate,
- b) subjecting the oxidant-coated substrate formed in step a) to a polymerization step by exposing the surface(s) of the oxidant-coated substrate to 3,4-ethylenedioxythiophene (EDOT) monomer vapour at a polymerization temperature to form a PEDOT layer on the surface(s) of the oxidant-coated substrate, and wherein, during the polymerization step, the temperature of the oxidant-coated substrate is kept at a controlled substrate temperature and wherein the controlled substrate temperature is 2-40° C. lower than the polymerization temperature.

The present application relates also to a method for producing a polymer film formed of a copolymer wherein one of the monomers of the copolymer is (3,4-ethylenedioxythiophene) (EDOT), comprising a substrate and at least one polymer layer formed of a copolymer wherein one of the monomers of the copolymer is EDOT monomer on at least one surface of the substrate wherein the method comprises the steps of:
- a) applying a solution comprising an oxidant and a base inhibitor on at least one surface of the substrate so as to form an oxidant coating on at least one surface of the substrate,
- b) subjecting the oxidant-coated substrate formed in step a) to a polymerization step by exposing the surface(s) of the oxidant-coated substrate to vapour of at least two different monomers, wherein one of the monomers is EDOT monomer at a polymerization temperature to form a polymer layer on the surface(s) of the oxidant-coated substrate, and
    - wherein, during the polymerization step, the temperature of the oxidant-coated substrate is kept at a controlled substrate temperature and wherein the controlled substrate temperature is 2-40° C. lower than the polymerization temperature.

The expression that the PEDOT layer or the polymer layer is "on" the surface of the substrate in the PEDOT film should be understood in this specification, unless otherwise stated, as meaning that the PEDOT layer or the polymer layer, respectively, is polymerized or formed to lie on or upon the substrate or is being at least partly embedded therein. The substrate may serve as a carrier or support structure for the PEDOT layer or the polymer layer. The substrate can be changed and the material of the substrate can vary according to the application to which the PEDOT film or the polymer film, respectively, is to be used.

The expression "film" should be understood in this specification, unless otherwise stated, as referring to a structure having its lateral dimensions substantially larger than its thickness. In that sense, a film may be considered as being a "thin" structure.

The polymerization temperature is the temperature of the monomer vapour during the polymerization step.

In one embodiment, the substrate is non-conducting substrate. The expression that the substrate is "non-conductive" should be understood in this specification, unless otherwise stated, as meaning that the substrate has a sheet resistance of 10 Mohms/square or higher.

The non-conducting substrate may be a substrate such as a glass, a polymer, paper, cellulose, textile, fabric, wood, leather, cotton, ceramic, composites such as cellulose-wood composites, fibreglass, teflon, rubber, quartz, paint, carbon material and/or con-conducting mineral. The non-conducting polymer substrate may be selected from the group consisting of plastic material selected from a group consisting of polyester, polyethylene terephthalate (PET), polycarbonates (PC), polyamide (PI), polyester sulfone (PES), polystyrene (PS), and amorphous polyester (A-PET or PET-G) and mixtures thereof. The non-conducting substrate may be a flexible non-conducting substrate. Flexible substrates can be used for production of flexible PEDOT films that can be bent and folded.

The oxidant is a substance that induces polymerization of monomers, and can act as a dopant after polymerization of a conductive polymer. The embedded anions may remain within the PEDOT structure to act as dopant ions. The conductivity of PEDOT polymer may be due to the delocalization of electrons or holes upon oxidation (doping). The oxidant may be selected from the group consisting of iron(III) p-toluenesulfonate, Iron(III)trifluoromethanesulfonate, iron(III)chloride, p-toluenesulphonic acid, iodine, bromine, molybdophosphoric acid, ammonium persulfate, DL-tartaric acid, polyacrylic acid, copper chloride, copper bromide, ferric chloride, naphthalenesulfonic acid, camphorsulfonic acid, Iron(III)toluene sulfonate, Iron(III)-perchlorate, $Cu(ClO_4)_2 \cdot 6H_2O$, cerium (IV) ammonium nitrate, cerium (IV) sulfate and any mixtures thereof.

Base inhibitors decrease the activity of the oxidant and lower the rate of polymerization. This may alter the conductivity of deposited polymer. The base inhibitor may be selected from the group consisting of amine-based compounds and nitrogen atom-containing saturated or unsaturated heterocyclic compounds such as a pyridine-based, imidazole-based, or pyrrole-based compounds, water vapor, glycerol, and glycol derivatives, and mixtures thereof.

The oxidant solution of the present invention comprises the oxidant, the base inhibitor and a solvent. The solvent may be selected from the group consisting of organic solvents such as n-butanol methyl alcohol, 2-butyl alcohol, ethyl cellosolve, ethyl alcohol, cyclohexane, ethyl acetate, toluene, acetonitrile and methyl ethyl ketone and mixtures thereof.

In one embodiment, the concentration of the oxidant solution is 60-500 mM, or 70-480 mM, or 120-320 mM, or 180-240 mM.

In one embodiment, the PEDOT layer is doped.

In one embodiment, the polymer layer formed of a copolymer wherein one of the monomers of the copolymer is EDOT is doped.

In one embodiment, the method is carried out by vapour phase polymerization.

Vapour phase polymerization is a polymerization technique where only the monomer(s) is(are) converted into vapour phase. The VPP method may involve coating the substrate with an oxidant and base inhibitor solution followed by drying to remove traces of solvent. In one embodiment, the vapour phase polymerization is carried out in atmospheric pressure. The vapour phase polymerization carried out in atmospheric pressure is easy to control. It does not need pressure control or sophisticated device or vacuum oven. The method may be used also for production of large area films. In one embodiment, the vapour phase polymerization is carried by out by roll to roll technique for production of large area films.

The polymerization temperature influences the properties of resulting PEDOT film or polymer film formed of a copolymer such as the rate of polymerization by controlling rate of volatilization of monomers and/or the mobility of a polymer chain. The decrease of the temperature increases the concentration of vapour molecules. The substrate temperature and the polymerization temperature control the rate of polymerization. The polymerization temperature and the substrate temperature influence the properties of the formed PEDOT film such as conductivity, transparency, a sheet resistance and morphology. The controlled substrate temperature is a factor in controlling the rate of polymerization which in turn controls the morphology of the PEDOT films or the polymer films formed of a copolymer. The controlled substrate temperature brings the uniform and homogeneous nature to the PEDOT films or to the polymer films formed of a copolymer.

In one embodiment, the solution comprising an oxidant and a base inhibitor is applied on one surface of the substrate and the oxidant coated surface of the substrate is exposed to EDOT monomer vapour at a polymerization temperature to form one PEDOT layer on the surface of the oxidant-coated substrate, thus producing a one-layered PEDOT film.

In one embodiment, the solution comprising an oxidant and a base inhibitor is applied on one surface of the substrate and the oxidant coated surface of the substrate is exposed to vapour of at least two different monomers, wherein one of the monomers is EDOT monomer at a polymerization temperature to form one polymer layer on the surface of the oxidant-coated substrate, thus producing a one-layered polymer film.

The method for producing multilayer PEDOT film or the method for producing multilayer polymer film formed of a copolymer may be carried out by layer-by-layer vapour phase polymerization. The PEDOT films may be formed by depositing PEDOT layers with wash steps in between. The polymer films formed of a copolymer may be formed by depositing polymer layers with wash steps in between.

In one embodiment the method for producing a PEDOT film comprises steps of
 c) applying the solution comprising the oxidant and the base inhibitor on at least one surface of the PEDOT layer formed in step b) so as to form an oxidant coating on the at least one surface of the PEDOT layer,
 d) subjecting the oxidant-coated PEDOT layer formed in step c) to a polymerization step by exposing the surface(s) of the oxidant-coated PEDOT layer to 3,4-ethylenedioxythiophene (EDOT) monomer vapour at a polymerization temperature to form a subsequent PEDOT layer on the surface(s) of the oxidant-coated PEDOT layer,
 wherein, during the polymerization step, the temperature of the oxidant-coated PEDOT film is kept at a controlled substrate temperature and wherein the controlled substrate temperature is 2-40° C. lower than the polymerization temperature.

In one embodiment the method for producing a polymer film formed of a copolymer wherein one of the monomers of the copolymer is EDOT comprises steps of
 c) applying a solution comprising an oxidant and a base inhibitor on at least one surface of the substrate so as to form an oxidant coating on at least one surface of the substrate,
 d) subjecting the oxidant-coated substrate formed in step a) to a polymerization step by exposing the surface(s) of the oxidant-coated substrate to vapour of at least two different monomers, wherein one of the monomers is EDOT monomer at a polymerization temperature to form a polymer layer on the surface(s) of the oxidant-coated substrate, and
 wherein, during the polymerization step, the temperature of the oxidant-coated substrate is kept at a controlled substrate temperature and wherein the controlled substrate temperature is 2-40° C. lower than the polymerization temperature.

The vapour of at least two different monomers comprises or consists of 3,4-ethylenedioxythiophene (EDOT) and at least one further monomer vapour selected from a group consisting of azulene, pyrrole, aniline, thiophene, phenylene furans, ethylene, tetrafluoroethylene, vinyl chloride, propylene, methyl methacrylate, methyl acrylate, vinyl acetate, ethylene vinyl acetate, styrene, 1,3-butadiene, isoprene(2-methyl-1,3-butadiene), chloroprene(2-chloro-1,3-butadiene), and isobutylene(methylpropene), polyethylene (PE), polypropylene (PP), polymethylpentene (PMP), polybutene-1 (PB-1); Polyolefin elastomers (POE): polyisobutylene (PIB), ethylene propylene rubber (EPR), ethylene propylene diene monomer (M-class) rubber (EPDM rubber) or any type of polymer produced from a simple olefin as a monomer, cyclic olefins, vinyl ether, allyl ether, vinyl easters and allyl easters.

VPP method may involve catalysts in polymerization. In one embodiment, at least one catalyst and/or at least one catalyst additive are/is used in step b) and/or d). In one embodiment, the at least one catalyst and/or catalyst additive is selected from the following: Ziegler-Natta catalysts, $AlCl_3$, $TiCl_3$, Cerium ammonium nitrate, Cerium tosylate, Fe(III)tosylate is also used as an oxidant, Pyridine, p-toluene sulphonic acid (p-TSA), Diethyleneglycol (DEG), Molybdophosphoric acid, Molybdo-2-vanadophosphoric acid, poly(styrenesulfonate)(PSS), Fe(III)alkylbenzenesulfonates, Iodine, bromine, Pyro-catechovoilet, Benzenesulfonic acid (BSA), p-toluenesulfonic acid (TSA), Dodecylbenzenesulfonic acid (DBSA), Butylbenzenesulfonic acid (BBSA), glycerol, trialkylaluminum-free modified methylaluminoxane, TEMPO ((2,2,6,6-Tetramethylpiperidin-1-yl)oxyl or (2,2,6,6-tetramethylpiperidin-1-yl)oxidanyl), peroxides, chloride or iodide of Ti, V, Zr, Cr, W, Co and aluminum (Mg or Li) alkyl TiCl4 with alkyl aluminium compounds in hydrocarbon solvent, titanium supported on magnesium salts, $VOCl_3$, $VCl_4$, or $VO(OR)_3$, with aluminum alkyls $RAlCl_2$, transitions metal (Zr, Ti or Hf) sandwiched between cyclopentadienyl rings, Cr, Mo, Co or Ni supported on alumina, silica, zirconia and activated carbon, Cr/SiO$_2$, Zr/Al$_2$O$_3$ and Ti/MgO, supported chromium oxide, bis(arene)CrO, chromium oxides supported on silica, alumina or titania.

In one embodiment, the temperature of the oxidant-coated substrate is kept at a controlled substrate temperature during the polymerization step, and the controlled substrate temperature is 2-30° C. lower than the polymerization temperature.

In one embodiment, the temperature of the oxidant-coated substrate is kept at a controlled substrate temperature during the polymerization step, and the controlled substrate temperature is 2-25° C., or 2-22° C., or 2-20° C., or 2-15° C., or 3-25° C., or 3-22° C. lower than the polymerization temperature.

In one embodiment, the temperature of the oxidant-coated substrate is kept at a controlled substrate temperature during the polymerization step, and the controlled substrate temperature is 3-20° C. lower than the polymerization temperature.

In one embodiment, the temperature of the oxidant-coated substrate is kept at a controlled substrate temperature during the polymerization step, and the controlled substrate temperature is 3-15° C. lower than the polymerization temperature.

In one embodiment, the temperature of the oxidant-coated substrate is kept at a controlled substrate temperature during the polymerization step, and the controlled substrate temperature is 5-20° C. lower than the polymerization temperature.

In one embodiment, the temperature of the oxidant-coated substrate is kept at a controlled substrate temperature during the polymerization step, and the controlled substrate temperature is 5-15° C. lower than the polymerization temperature.

In one embodiment, the temperature of the oxidant-coated substrate is kept at a controlled substrate temperature during the polymerization step, and the controlled substrate temperature is 8-12° C. lower than the polymerization temperature.

In one embodiment, the solution comprising an oxidant and a base inhibitor is applied on the surface of the one PEDOT layer formed in step b), the one-layered PEDOT film, and the oxidant coated surface of the PEDOT layer is exposed to EDOT monomer vapour at a polymerization temperature to form a second PEDOT layer on the surface of the oxidant-coated PEDOT layer, thus producing a two-layered PEDOT film.

In one embodiment, the method comprises repeating step c) and step d) at least once for producing multilayer PEDOT film.

In one embodiment, the solution comprising an oxidant and a base inhibitor is applied on the surface of the one polymer layer formed of the copolymer formed in step b), the one-layered polymer film, and the oxidant coated surface of the polymer layer is exposed to vapour of at least two different monomers, wherein one of the monomers is EDOT monomer at a polymerization temperature to form a second polymer layer on the surface of the oxidant-coated polymer layer, thus producing a two-layered polymer film.

In one embodiment, the method comprises repeating step c) and step d) at least once for producing multilayer polymer film formed of the copolymer.

During polymerization step the substrate temperature and the polymerization temperature are controlled separately. In one embodiment the polymerization temperature is 55-95° C. and the controlled substrate temperature is 40-70° C. In one embodiment, the polymerization temperature is 60-85° C. and the controlled substrate temperature is 45-70° C. In one embodiment, the polymerization temperature is 65-80° C. and the controlled substrate temperature is 55-70° C., or the polymerization temperature is 67-77° C. and the controlled substrate temperature is 56-66° C., or the polymerization temperature is 72-77° C. and the controlled substrate temperature is 61-66° C. The vapour phase polymerization of the present invention has no need of high temperature.

In one embodiment, the process is carried out as a batch process. I.e. one film can be prepared at one go, e.g. in a cell or a reaction chamber, wherein the different method steps can be carried out. In one embodiment, the method is carried out as a continuous process. I.e. the substrate can be moved from one method step into the other without interruptions. E.g. being first coated with the oxidant and then exposed to monomer vapour(s). In a continuous process, several films may be prepared simultaneously.

In one embodiment, the temperature of the oxidant-coated substrate and/or the oxidant-coated PEDOT film is kept at the controlled substrate temperature substantially during the entire polymerization step.

In one embodiment, the polymerization step is subdivided into sequential processing periods to tune the rate of polymerization.

In one embodiment, the polymerization step comprises two sequential processing periods, the temperature of the oxidant-coated substrate and/or the oxidant-coated PEDOT film is kept at the controlled substrate temperature throughout one of the processing periods.

In one embodiment, the polymerization step comprises two sequential processing periods, wherein the temperature of the oxidant-coated substrate and/or the oxidant coated polymer film formed of copolymer is kept at the controlled substrate temperature throughout one of the processing periods.

In one embodiment, the polymerization step comprises three sequential processing periods, wherein the temperature of the oxidant-coated substrate and/or the oxidant-coated PEDOT film is kept at the controlled substrate temperature throughout the middle processing period.

In one embodiment, the polymerization step comprises three sequential processing periods, wherein the temperature of the oxidant-coated substrate and/or the oxidant coated polymer film formed of copolymer is kept at the controlled substrate temperature throughout the middle processing period.

During the processing period when the substrate is not kept at the controlled substrate temperature, the substrate temperature may change towards the ambient temperature, i.e. the polymerization temperature. The substrate temperature will cool towards the polymerization temperature, if the substrate temperature is higher than the polymerization temperature, or the substrate temperature will warm up towards the polymerization temperature, if it is lower than the polymerization temperature in the beginning of such a processing period.

In one embodiment, the method of the present application comprises the step of cleaning the substrate before step a). In one embodiment, the substrate was cleaned by ultrasonication with a solvent. The solvent may be selected from the group consisting of organic solvents such as acetone and EtOH, water and mixtures thereof. The cleaning step may be repeated with same or different solvents.

In one embodiment, the cleaned substrate is dipped in hot solution of H$_2$O:NH$_4$OH (25%):H$_2$O$_2$ (30%) as 5:1:1 volume ratio to remove any organic impurities left behind on the surface which was then followed by oxygen plasma treatment.

In one embodiment, the oxidant solution is spin-coated on at least one surface of the substrate in step a). In one embodiment, the oxidant solution is spin-coated on at least one surface of the at least one surface of the PEDOT layer formed in step c). In one embodiment, the oxidant solution is spin-coated on at least one surface of the at least one surface of the polymer layer formed of copolymer formed in step c). In one embodiment, the oxidant solution is spin coated on the substrate at 800-3500 rpm. In one embodiment, the oxidant solution is spin coated on the substrate for 5-30 s.

In one embodiment, the method comprises cleaning, drying and/or heating the oxidant-coated non-conductive substrate from step a) before step b). In one embodiment, the method comprises cleaning, drying and/or heating the PEDOT film from step c) before step d). In one embodiment, the method comprises cleaning, drying and/or heating the polymer film formed of copolymer from step c) before step d). In one embodiment, the oxidant-coated non-conductive substrate is heated at 80-100° C. In one embodiment, the PEDOT film from step c) is heated at 80-100° C. In one embodiment, the polymer film formed of copolymer from step c) is heated at 80-100° C.

In one embodiment, the method comprises the step of annealing the PEDOT film at a temperature 50 100° C. after polymerization. In one embodiment, the method comprises the step of annealing the polymer film formed of copolymer at a temperature 50-100° C. after polymerization. The PEDOT film or the polymer film can be annealed to avoid stress fracture of the film during the washing step. The annealed PEDOT film or the polymer film may be washed to remove unreacted oxidant, monomer and any other impurities because the unconsumed oxidant and monomer traces may decrease the conductance. In one embodiment, the annealed PEDOT film is washed by dip rinsing thoroughly in ethanol followed by MeCN. In one embodiment, the annealed PEDOT film is dried. In one embodiment, the annealed PEDOT film is dried under dry nitrogen gas stream. In one embodiment, the annealed polymer film formed of copolymer is washed by dip rinsing thoroughly in ethanol followed by MeCN. In one embodiment, the annealed polymer film formed of copolymer is dried. In one embodiment, the annealed polymer film formed of copolymer is dried under dry nitrogen gas stream.

In one embodiment, the method comprises the step of cleaning the PEDOT polymer film received from step b) before the step c). In one embodiment, the PEDOT polymer film is cleaned by annealing the PEDOT film at a temperature 50-100° C. after polymerization. In one embodiment, the annealed PEDOT film is washed by dip rinsing thoroughly in ethanol followed by MeCN. In one embodiment, the annealed PEDOT film is dried. In one embodiment, the annealed PEDOT film is dried under dry nitrogen gas stream.

In one embodiment, the method comprises the step of cleaning the polymer film formed of copolymer received from step b) before the step c). In one embodiment, the polymer film formed of copolymer is cleaned by annealing the polymer film at a temperature 50-100° C. after polymerization. In one embodiment, the annealed polymer film formed of copolymer is washed by dip rinsing thoroughly in ethanol followed by MeCN. In one embodiment, the annealed polymer film formed of copolymer is dried. In one embodiment, the annealed polymer film formed of copolymer is dried under dry nitrogen gas stream.

The polymerization time may effect on the properties such as a sheet resistance and a roughness average of the formed PEDOT film or the formed polymer film formed of copolymer, respectively.

In one embodiment, the duration of the polymerization step is 1-20 minutes. In one embodiment, the duration of the polymerization step is 1-10 minutes. In one embodiment, the duration of the polymerization step is 2-8 minutes. The polymerization step is fast.

In one embodiment, the duration of the processing period of the polymerization step, wherein the temperature of the oxidant-coated non-conductive substrate and/or the oxidant-coated PEDOT film is kept at a controlled substrate temperature is 20-80% of the duration of the polymerization step.

In one embodiment, the duration of the processing period of the polymerization step, wherein the temperature of the oxidant-coated non-conductive substrate and/or the oxidant-coated polymer film formed of copolymer is kept at a controlled substrate temperature is 20-80% of the duration of the polymerization step.

In one embodiment, the duration of the polymerization step processing period, wherein the temperature of the oxidant-coated non-conductive substrate and/or the oxidant-coated PEDOT film is kept at a controlled substrate temperature is 30-60% of the duration of the polymerization step. In one embodiment, the duration of the polymerization step processing period, wherein the temperature of the oxidant-coated non-conductive substrate and/or the oxidant-coated PEDOT film is kept at a controlled substrate temperature is 35-40% of the duration of the polymerization step.

In one embodiment, the duration of the polymerization step processing period, wherein the temperature of the oxidant-coated non-conductive substrate and/or the oxidant-coated polymer film formed of copolymer is kept at a controlled substrate temperature is 30-60% of the duration of the polymerization step. In one embodiment, the duration of the polymerization step processing period, wherein the temperature of the oxidant-coated non-conductive substrate and/or the oxidant-coated polymer film formed of copolymer is kept at a controlled substrate temperature is 35-40% of the duration of the polymerization step.

In one embodiment, the non-conductive substrate is glass. In one embodiment, the non-conductive substrate is polyethylene terephthalate (PET).

In one embodiment, the oxidant is Iron(III) p-toluenesulfonate hexahydrate (FETOS).

In one embodiment, the oxidant is Iron (III) trifluoromethanesulfonate $Fe(OTF)_3$.

In one embodiment, the base inhibitor is pyridine.

In one embodiment, the oxidant solution comprises or consists of FETOS and pyridine in n-butanol. In one embodiment, the oxidant solution comprises the oxidant at a proportion of 5%-50% by weight relative to the volume of the oxidant solution.

The present application further relates to a conducting PEDOT film, comprising a non-conductive substrate, a PEDOT layer having anions from an oxidant/oxidants embedded in the PEDOT layer on the non-conductive substrate, wherein the conducting PEDOT film has conductivity of over 2100 S/cm and sheet resistance of below 200Ω/□.

The present application further relates to a conducting PEDOT film obtainable by the method of the present application comprising a non-conductive substrate, a PEDOT layer having anions from an oxidant/oxidants embedded in the PEDOT layer on the non-conductive substrate, wherein the conducting PEDOT film has conductivity of over 2100 S/cm and sheet resistance of below 200Ω/□.

In one embodiment, the conducting PEDOT film has a sheet resistance of below 250Ω/□. In one embodiment, the conducting PEDOT film has a sheet resistance of below 240Ω/□.

In one embodiment, the conducting PEDOT film has a conductivity of over 3200 S/cm and a sheet resistance below 21Ω/□. In one embodiment, the conducting PEDOT film has a conductivity of over 3200 S/cm and a sheet resistance 12Ω/□.

Van der Pauw method can be used to calculate sheet resistance ($r_{sheet}$) for PEDOT films. The specific resistance (r) of the film is obtained by multiplying sheet resistance with film thickness (d), equation (1):

$$r = r_{sheet} d \quad (1)$$

The conductivity (s) of the film is obtained according to equation (2)

$$s = 1/r \quad (2)$$

CV and EIS techniques can be used for electrochemical characterization. The charge (Q) is calculated by integration of the cyclic voltammogram in the potential range −0.25 to 0.75 V in the Origin software which is further processed by using following equations to obtain capacitance values:

$$\text{Areal capacitance}, C_A = Q/(\Delta V^* A) \quad (3)$$

$$\text{Volumetric Capacitance}, C_V = Q/(\Delta V^* V) \quad (4)$$

Where, '$\Delta V$' is the potential window, 'A' is the area and 'V' is the volume of working electrode.

In one embodiment, the conducting PEDOT film comprises 1-20 PEDOT layers on the non-conductive substrate. In one embodiment, the conducting PEDOT film comprises 1-15 PEDOT layers on the non-conductive substrate. In one embodiment, the conducting PEDOT film comprises 1-10 PEDOT layers on the non-conductive substrate.

In one embodiment, the the roughness average of the conducting PEDOT film is below 3.5 nm.

Roughness average values of the PEDOT film are obtained from the AFM images by using WSXM software. The roughness average (Ra) is the mean of the difference, in absolute value, between the average height and the height of each single point of the sample. This number varies with the interval range. It shows how uniform or rough the PEDOT film is.

In one embodiment, the % transmittance of the conducting PEDOT film at 550 nm is over 30% T. In one embodiment, the the % transmittance of the conducting PEDOT film is over 80% T.

Agilent 8453 spectrometer can be used to record the UV-Vis spectra. The % Transmittance (% T) is calculated from the absorbance data by using following equation (5), $$(\% T) = (10^{(-Abs)}) * 100 \quad (5)$$

In one embodiment, the non-conductive substrate of the PEDOT film is glass. In one embodiment, the non-conductive substrate of the PEDOT film is polyethylene terephthalate (PET).

In one embodiment, the PEDOT layer has anions from Iron(III) p-toluenesulfonate hexahydrate (FETOS) embedded in the PEDOT layer on the non-conductive substrate.

The thickness of the conducting PEDOT film may be designed in accordance with the properties of the conducting PEDOT film, especially the conductivity, resistance, roughness average or transmittance thereof or combinations of the properties. In one embodiment, the thickness of the PEDOT film is 10-500 nm, or 10-300 nm, or 20-200.

The present application further relates to a conducting polymer film formed of a copolymer wherein one of the monomers of the copolymer is (3,4-ethylenedioxythiophene) (EDOT), comprising a non-conductive substrate, a polymer layer formed of a copolymer wherein one of the monomer of the copolymer is EDOT, having anions from an oxidant/oxidants embedded in the polymer layer formed of a copolymer on the non-conductive substrate, wherein the thickness of the conducting polymer film is 10-500 nm or 10-200 nm.

In one embodiment, the transmittance of the film at 550 nm is 10-95%, or 20-85%, or 30-75%.

In one embodiment, the areal capacitance of the film is 0-10 mF/cm$^2$, or 0.01-9 mF/cm$^2$, or 0.05-8 mF/cm$^2$, or 0.2-7 mF/cm$^2$, or 1-5 mF/cm$^2$, or 2 4 mF/cm$^2$. In one embodiment, the areal capacitance of the film is 0-25 mF/cm$^2$, or 0.01-15 mF/cm$^2$, or 0.05-10 mF/cm$^2$, or 0.2-7 mF/cm$^2$, or 1-5 mF/cm$^2$, or 2 4 mF/cm$^2$.

In one embodiment, the volumetric capacitance of the film is 200-2000 F/cm$^3$, or 250-1500 F/cm$^3$, or 300-1200 F/cm$^3$, or 500-1000 F/cm$^3$, or 600-800 F/cm$^3$. In one embodiment, the volumetric capacitance of the film is 5000-18000 F/cm$^3$, or 6000-17500 F/cm$^3$, or 7000-17000 F/cm$^3$.

In one embodiment, the conductivity of the film is 0-3 S·cm, or 0.01-2 S·cm, or 0.05-1.5 S·cm, or 0.1-1.0 S·cm, or 0.3-0.8 S·cm, or 0.4-0.6 S·cm. The conductivity may be measured before or after the washing of the film. After the washing the conductivity value may be higher or lower than before the washing step. At low polymerization temperatures, the conductivities are lower before the washing step. At high polymerization temperatures, the conductivities are lower after the washing step.

Jandel model RM3000+ with cylindrical four point probe head was used to obtain sheet resistance ($r_{sheet}$) values for the PEDOT-copolymer films. In one embodiment, the sheet resistance of the film is 1-80 MΩ/□, or 2-70 MΩ/□, or 5-50 MΩ/□, or 10-40 MΩ/□, or 15-30 MΩ/□. In one embodiment, the sheet resistance of the film is 0.01-2 MΩ/□, or 0.05-1.5 MΩ/□, or 0.08-1.1 MΩ/□, or 0.2-1.1 MΩ/□, or 0.6-1 MΩ/□. The sheet resistance may be measured before or after the washing of the film. After the washing the sheet resistance value may be higher or lower than before the washing step.

The present application further relates to a conducting polymer film formed of a copolymer wherein one of the monomer of the copolymer is (3,4-ethylenedioxythiophene) (EDOT) obtainable by the method of the present application comprising a non-conductive substrate, a polymer layer formed of a copolymer wherein one of the monomer of the copolymer is EDOT, having anions from an oxidant/oxidants embedded in the polymer layer formed of a copolymer on the non-conductive substrate, wherein the thickness of the conducting polymer film is 10-500 nm or 10-200 nm.

In one embodiment, the conducting polymer film formed of a copolymer wherein one or the monomers of the copolymer is EDOT comprises 1-20, or 1-15 polymer layers on the non-conductive substrate.

In one embodiment, the conducting polymer film is formed of EDOT and azulene. In one embodiment, the conducting polymer film is formed of EDOT and pyrrole. In one embodiment, the conducting polymer film is formed of EDOT and thiophene. In one embodiment, the conducting polymer film is formed of EDOT and phenylene. The conducting polymer film can also be formed of EDOT and at least one of monomers selected from a group consisting of azulene, pyrrole, aniline, thiophene, and phenylene.

The present application further relates to an electronic device comprising a conducting PEDOT film of the present application.

The present application further relates to an electronic device comprising a conducting polymer film formed of a copolymer of the present application.

In one embodiment, the electronic device is a display, a flat panel display, an optoelectronic devise such as an organic light emitting diode OLED, an organic solar cell, a dye-sensitized solar cell, a perovskite solar cell, a smart window, a fuel cell, an organic electrochemical transistor, an electrochemical transducer, an electrochromic device, an electroluminescent device, an electroluminescent display, an organic capacitor, a supercapacitor, a sensor, a biosensor, an energy harvesting device, an antistatic material, a photovoltaic device, a storage device or a thermoelectric device. In one embodiment, the electronic device is an optoelectronic device. In one embodiment, the electronic device is a transparent electrode. In one embodiment, the electronic device is a supercapacitor.

The present application further relates to the use of the conducting PEDOT film of the present application as an antistatic coating or an electrode in/of an electronic device.

The present application further relates to the use of the conducting polymer film formed of a copolymer of the present application as an antistatic coating or an electrode in/of an electronic device.

The method of the present application has the added utility of being simple, low cost and fast due to the atmospheric pressure controlled polymerization. Further, the method of the present application has the added utility of producing thin multilayered PEDOT films or multilayered polymer films formed of a copolymer at nanometer scale. Further, the method can be used to a large surface area and is not limited to conducting substrates. The PEDOT films and the polymer films formed of a copolymer of the present application have the added utility of being very uniform and homogeneous as well as smooth and flexible. Further, the PEDOT films and the polymer films formed of a copolymer of the present application have the added utility of having high conductivity and transmittance.

EXAMPLES

Reference will now be made in detail to various embodiments, an example of which is illustrated in the accompanying drawings.

The description below discloses some embodiments in such a detail that a person skilled in the art is able to utilize the embodiments based on the disclosure. Not all steps or features of the embodiments are discussed in detail, as many of the steps or features will be obvious for the person skilled in the art based on this specification.

For reasons of simplicity, item numbers will be maintained in the following exemplary embodiments in the case of repeating components.

FIG. 1 illustrates a vapor phase polymerization cell for carrying out vapour phase polymerization. The polymerization cell 1 comprises a stand 3 for the substrate 4 and for the metal block 5. Thermostatic baths 7 are attached to the polymerization cell 1 to keep the temperature of the monomer vapour 6 at the polymerization temperature. The thermostatic bath 8 is attached to the metal block 5 to keep the temperature of the substrate 4 at the controlled substrate temperature. The polymerization cell 1 comprises a lead 2 which is used to close the polymerization cell 1.

FIGS. 6 and 7 illustrate the set ups for a continuous VPP process for flexible (FIG. 6) and rigid (FIG. 7) substrates according to one embodiment described in the present application. Solution comprising the oxidant 10 is deposited on the substrate 4 by roll to roll technique, followed by drying of the oxidant 11 and preheating 13 in an oven or with a heater 12. In the next step, the substrate 4 covered with an oxidant is exposed to monomer vapour(s) in the polymerization chamber or cell 1. The speed of the rollers determines the time substrate spends inside the chamber. Temperature of the substrate or the deposition surface is controlled with a heater/temperature controller 14. Next, the film is annealed 15, followed by the washing of the solvent 16. Finally, the film is dried (with nitrogen gas) 17 and the substrate covered with a film 18 is obtained.

Figure 8:
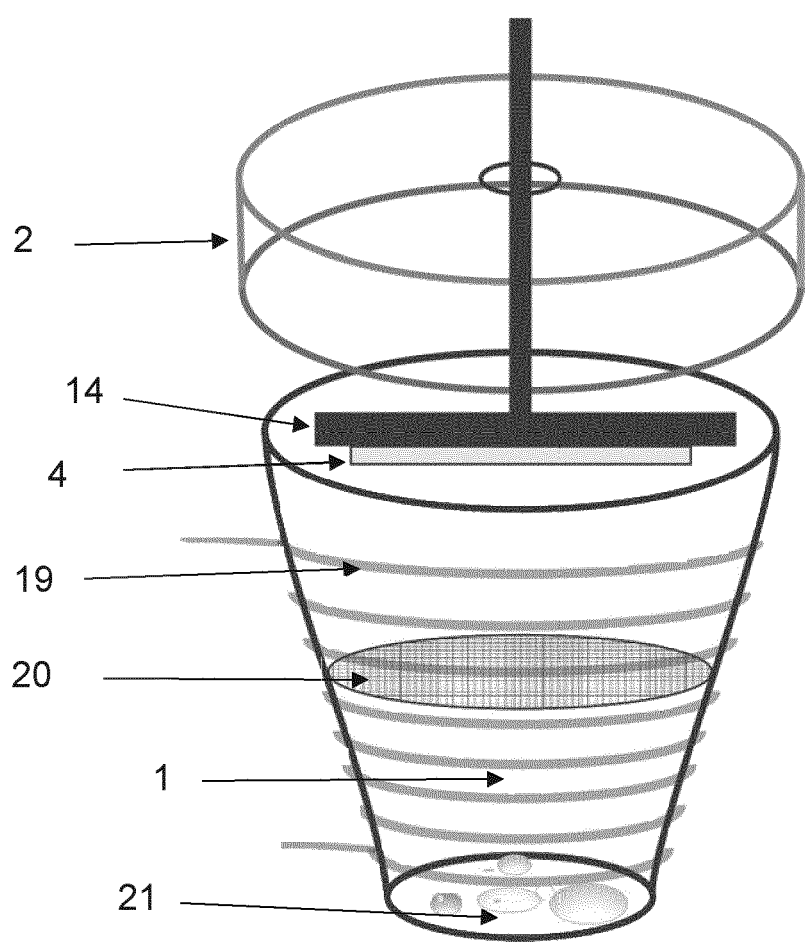
FIG. 8 illustrates a scaled up vapour phase polymerization cell for carrying out the vapour phase polymerization in a larger scale.

FIG. 8 illustrates a scaled up VPP cell for carrying out VPP according to one embodiment described in the present application. The polymerization cell 1 includes the substrate 4 and a heater/temperature controller 14 for the substrate. Heating coils 19 are used to vaporize the monomer in the cell and heat it to the desired polymerization temperature. The cell further includes a vapour homogenizer 20 and an adjustable lead 2 to close the polymerization cell 1. The homogenizer provides a homogenious distribution of vapours onto the substrate 4 surface. The position such as the height of the substrate 4 in the polymerization cell can be adjusted based on the substrate size and cell size. The height can be controlled in the VPP cell by lowering or raising the heater/temperature controller 14.

Example 1—Preparation of the PEDOT Film

Glass slides (substrates) (37.5 mm×25 mm) were cleaned by ultra-sonication with acetone, water and EtOH, respectively in each for 5 min. The cleaned substrates were dipped in hot solution (80° C.) of $H_2O:NH_4OH$ (25%):$H_2O_2$ (30%) as 5:1:1 volume ratio for 5 min to remove any organic impurities left behind on the surface which was then followed by oxygen plasma treatment for 5 min. 0.236 M FETOS solution containing 0.141 M pyridine was prepared in n-butanol (oxidant solution). 60 µl of oxidant solution was spin coated on the substrate at 1450 rpm for 20 s. The oxidant coated substrate was dried on a hot plate at 90° C. for 90 s. The dried substrate was transferred to a preheated cell 1 containing EDOT monomer 6 at 75° C. in such a way that the coated surface faced down towards the vapors. Polymerization was carried out for 4 min in 3 different steps. The cell 1 was covered with a glass lid 2 during first 90 s. The cell 1 was thereafter uncovered and the substrate temperature was kept at 65° C. by a heated metal block 5 for the next 90 s. The metal block 5 was removed and the cell 1 was covered with a glass lid 2 for 60 s. Annealing of the film was done after polymerization on a hot plate at 90° C. for 90 s. After annealing, the film was let to cool to room temperature and dip rinsed thoroughly in ethanol followed by MeCN to remove unreacted oxidant, monomer and any other impurities. Washing was done to remove the unconsumed oxidant and monomer traces which may otherwise decrease the conductance. After washing, the film was dried under dry nitrogen gas stream. The procedure was repeated from the spin coating step to prepare 1 to 6 layers of PEDOT on the glass substrate 4 (1L to 6L PEDOT). The temperature of the cell 1 and metal block 5 was controlled by thermostat baths 7, 5.

The volume of oxidant solution can vary between 50-120 µl. The volume of oxidant solution can be changed according to the size of the substrate.

The sheet resistance values and surface morphology of the PEDOT films were monitored by changing the parameters for the VPP method. The remaining parameters of the method were kept constant while monitoring one particular parameter at a time. The polymerization was carried out by keeping the temperature in the cell 1, the polymerization temperature, at 55, 65, 75, 85° C. for monitoring the VPP cell temperature. Polymerization time of 2, 4, 6, and 8 min were used to prepare the PEDOT films. The substrate temperature was not controlled while monitoring the VPP cell temperature and the polymerization time. PEDOT films were prepared at different substrate temperatures from 45° C. to 75° C. The substrate temperature was changed by controlling the temperature of the metal block 5. The annealing of the PEDOT films was performed at 60, 70, 80, 90, 100, and 110° C.

Characterization

Renishaw Qontor inVia Raman microscope was used to record Raman spectra (785 nm excitation). Agilent 8453 (up to 1000 nm) and Cary 5E spectrophotometer (VARIAN) (up to 2400 nm) were used to record UV-Vis-NIR measurements (background correction was done using an uncoated microscope glass slide). Van der Pauw method was used to calculate sheet resistance ($r_{sheet}$) for 1L to 6L PEDOT. Resistance values were recorded as the average of three measurements using the 4-point probe (square shape with a side a=2.2 mm) and Keithley multimeter (Model 2000). The specific resistance (r) and conductivity (s) of the film was calculated from equations (1) and (2).

AFM measurements were carried out using Veeco diCaliber scanning probe microscope operated in a tapping mode at room temperature. All AFM images were recorded using Bruker TESP-MT probe (resonant freq. 320 kHz, spring const. 42 N/m, length 125 µm, width 30 µm, Cantilever spec: 0.01-0.025 Ωcm Antimony (n) doped Silicon, 4 µm thick, tip spec: 10-15 µm height, 8 nm radius). WSXM software was used to determine mean roughness (roughness average (Ra)) values of PEDOT films.

CV and EIS techniques were used for electrochemical characterization. CV measurements were carried out in conventional 3 electrode configuration using 0.1M TBA-BF$_4$/MeCN. VPP prepared PEDOT films on glass slides covered with different number of PEDOT layers were used as working electrodes. The area of the working electrode was 1.13 cm$^2$. A Ag/AgCl wire and a platinum wire were used as reference and counter electrode, respectively. Ag/AgCl reference electrode was calibrated before and after every electrochemical measurement using ferrocene redox couple ($E_{1/2}$ (Fe/Fe$^+$)=0.47 V). Cyclic voltammograms were recorded using Metrohm Autolab PGSTAT 101 potentiostat in a potential range from −0.25 V to 0.75 V at a scan rate of 100 mV/s for 1L to 6L PEDOT. The charge (Q) is calculated by integration of the cyclic voltammogram in the potential range −0.25 to 0.75 V in the Origin software which is further processed by using equations (3) and (4) to obtain capacitance values.

Results

The effect of the polymerization temperature on the sheet resistance and the roughness average of PEDOT films are shown in table 1.

TABLE 1

| Polymerization (Cell) temperature (° C.) | Sheet resistance (Ω/□) | Roughness average (nm) |
| --- | --- | --- |
| 55 | 235.56 | 0.77 |
| 65 | 208.18 | 0.68 |
| 75 | 201.26 | 0.75 |
| 85 | 224.15 | 1.13 |

The effect of the substrate temperature on the sheet resistance and the roughness average of PEDOT films are shown in table 2.

TABLE 2

| Substrate temperature (° C.) | Sheet resistance (Ω/□) | Roughness average (nm) |
| --- | --- | --- |
| 45 | 208.82 | 1.02 |
| 55 | 206.21 | 1.07 |
| 65 | 197.08 | 0.93 |
| 75 | 208.35 | 0.82 |

The polymerization temperature is a factor influencing the properties of resulting PEDOT films such as the rate of polymerization by controlling rate of volatilization of monomers (reactant), the mobility of a polymer chain, conductivity, and morphology. The roughness average ($R_a$) of the PEDOT film increased with an increase in the VPP cell 1 temperature (Table 1). This increase in the roughness-average is due to the high concentration of vapor at elevated temperatures forcing the condensation of vapor at the surface of a substrate. PEDOT films prepared were very uniform and homogeneous.

The roughness-average of the PEDOT films decreased with an increase in the substrate temperature (Table 2). This phenomenon is due to the fast condensation of monomer vapor at a low temperature resulting in less homogeneous films. As the temperature is increased, the condensation rate is decreased resulting in more uniform film formation. The same behavior also explains the decrease in the sheet resistance of the PEDOT film with the increase in substrate temperature up to 65° C. The sheet resistance increased for films prepared at 75° C. which is due to less deposition of monomer vapor favored by the high substrate temperature.

The effect of polymerization time on the sheet resistance and roughness average of PEDOT films are shown in table 3.

TABLE 3

| Time (min) | Sheet resistance (Ω/□) | Roughness average (nm) |
| --- | --- | --- |
| 2 | 208.45 | 1.01 |
| 4 | 201.61 | 1.09 |
| 6 | 210.68 | 0.78 |
| 8 | 235.56 | 1.11 |

PEDOT films were prepared at different polymerization times i.e. 2, 4, 6, and 8 min. The PEDOT film prepared during 6 min showed the lowest roughness-average value and the PEDOT film prepared at 4 min polymerization time showed the lowest sheet resistance (Table 3). The sheet resistance decreased after annealing. The film annealed at 60°, 70, 80, and 90° C. showed all similar sheet resistance. The decrease in sheet resistance in the range of 60° C. to 90°

C. of annealing temperature ensures the curing and the completion of the polymerization process.

Characterization of Multilayer PEDOT Films

Figure 2:
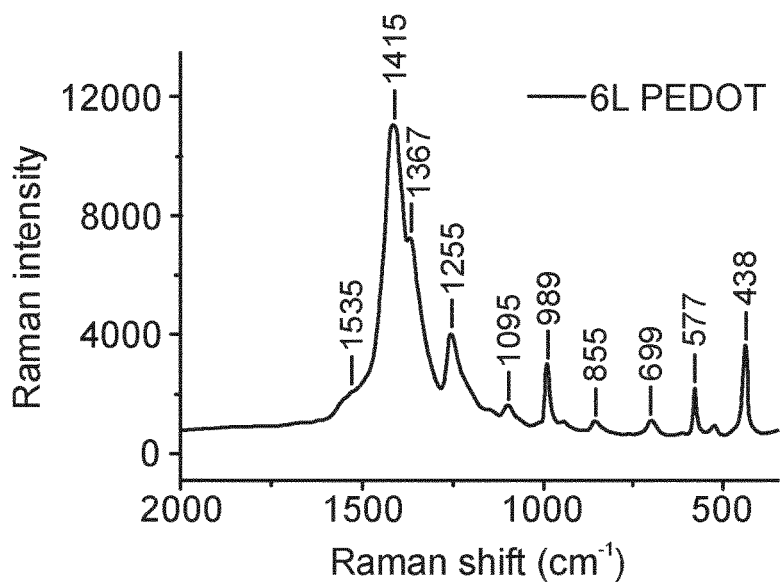
FIG. 2 illustrates the Raman Spectrum of 6 layer PEDOT film produced by the vapour phase polymerization method.

FIG. 2 illustrates the Raman Spectrum of 6 layer PEDOT film. The band at 577, 699, 989, 1095, 1255, 1367, 1415, and 1530 cm' are assigned to oxyethylene ring deformation, symmetric C—S—C deformations, oxyethylene ring deformations, C—O—C deformations, $C_\alpha$-$C_{\alpha'}$ inter-ring stretching, $C_\beta$-$C_{\beta'}$ stretching, symmetric $C_\alpha=C_\beta$ (—O) stretching, and $C_\alpha=C_\beta$ stretching, respectively.

Figure 3:
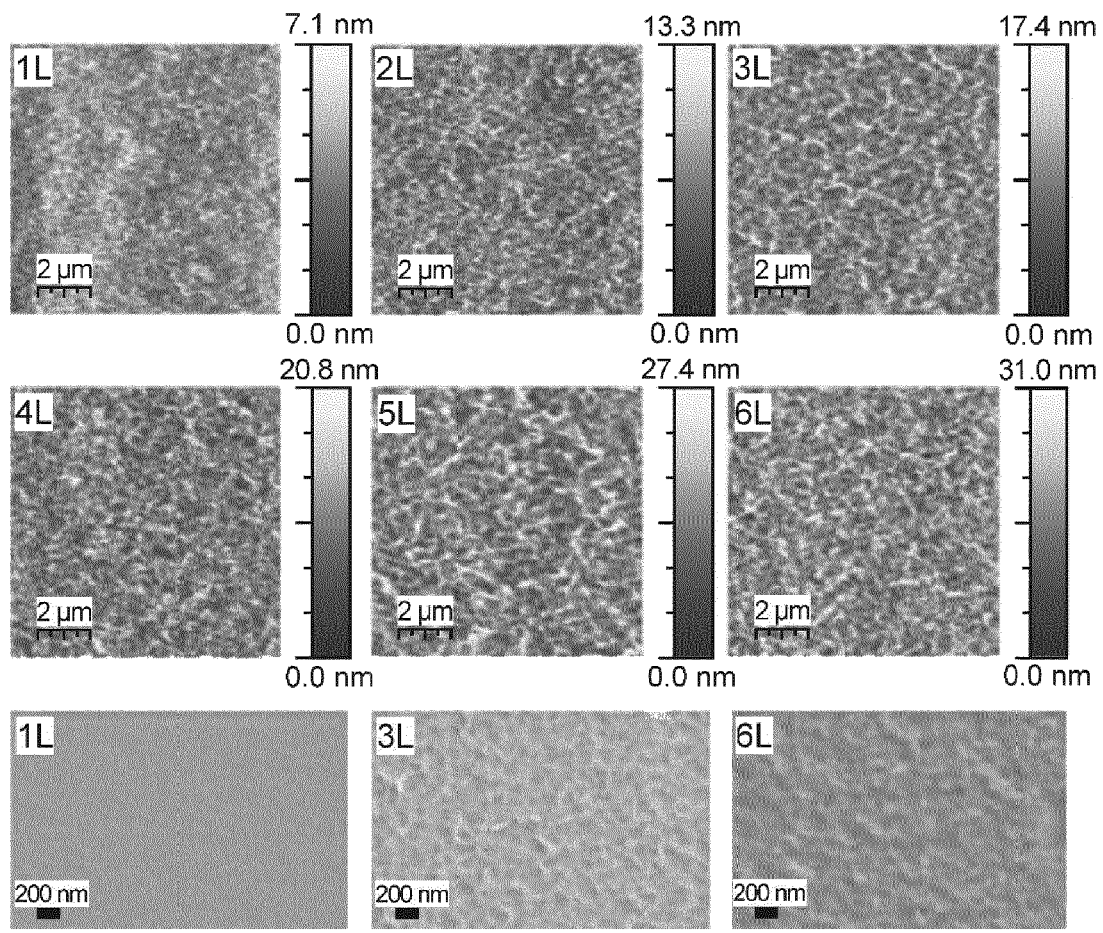
FIG. 3 illustrates AFM images of 1L) 1 layer of PEDOT, 2L) 2 layers of PEDOT, 3L) 3 layers of PEDOT, 4L) 4 layers of PEDOT, 5L) 5 layers of PEDOT, 6L) 6 layers of PEDOT and SEM images of 1L, 3L and 6L PEDOT.

FIG. 3 illustrates AFM images of 1L) 1 layer of PEDOT, 2L) 2 layers of PEDOT, 3L) 3 layers of PEDOT, 4L) 4 layers of PEDOT, 5L) 5 layers of PEDOT, 6L) 6 layers of PEDOT and SEM images of 1L, 3L and 6L PEDOT. FIG. 3 shows the AFM images of 1L to 6L PEDOT and SEM images of 1L, 3L and 6L with very uniform, homogeneous, sheet like nature of the films. Materials to be used in optoelectronics need to have high surface smoothness. From the AFM images and roughness average values (Table 4), it can be observed that the roughness doesn't exceed 1 nm for 1L PEDOT and 4 nm for 6L. This indicates that there is a small increase in surface roughness but the uniform, homogeneous, sheet like nature was not affected with the increment of additional layers. Thickness measurements were verified with the average of multiple measurements across the large scan area of the PEDOT films. 1L PEDOT shows conductivity of 2178 S/cm and 6L PEDOT shows the maximum value of 3208 S/cm (Table 4). Vapor phase polymerized PEDOT films prepared using FETOS as oxidant form closely packed large conductive domains which increase the in-plane conductivity. Sheet resistance decreases from 194.56Ω/□ for 1L PEDOT to 20.55Ω/□ for 6L PEDOT (Table 4). 2L PEDOT showed 57.7% decrease in the sheet resistance from 1L PEDOT but almost the same conductivities due to the increase in thickness. 3L PEDOT shows 35.4% decrease in sheet resistance from 2L PEDOT with a small increase in conductivity. Decrease in the sheet resistance when going from 3L to 6L PEDOT is almost linear but 3L and 4L PEDOT show almost similar conductivity values. Decrease in sheet resistance and increase in conductance from 1L PEDOT to 6L PEDOT also indicate a fast charge transfer from layer to layer (Table 4). This is facilitated by the efficient delocalization of the polaron and polaron pairs or bipolaron on PEDOT chains over different layers. This extended conjugation allows faster charge/electron transfer across the film.

Table 4 shows number of layers (L), thickness (d), sheet resistance ($r_{sheet}$), conductivity (s), areal capacitance ($C_A$), volumetric capacitance ($C_v$), percent transmittance (% T), and roughness average ($R_a$) for VPP produced PEDOT 1-6-layered films.

TABLE 4

| L | d (nm) | $r_{sheet}$ (Ω/□) | s (S/cm) | $C_A$ (mF/cm$^2$) | $C_v$ (F/cm$^3$) | % T (at 550 nm) | $R_a$ (nm) |
|---|---|---|---|---|---|---|---|
| 1 | 23.6 | 194.6 | 2178 | 1.60 | 679 | 88 | 0.7 |
| 2 | 57.1 | 82.3 | 2128 | 3.42 | 600 | 77 | 1.6 |
| 3 | 81.2 | 53.2 | 2317 | 5.20 | 641 | 66 | 1.9 |
| 4 | 108.7 | 39.6 | 2325 | 7.35 | 676 | 56 | 2.3 |
| 5 | 125.0 | 28.5 | 2811 | 9.29 | 744 | 43 | 3.2 |
| 6 | 151.7 | 20.6 | 3208 | 10.67 | 704 | 35 | 3.4 |

According to the polaron theory of conductivity, electron transfer occurs through the motion of polarons and bipolarons/polaron pairs along the polymer chain with a reorganization of double and single bonds. Increased doping level results in an increase in conductivity.

As can be seen from table 4, a single layer of PEDOT is highly transparent.

Figure 4:
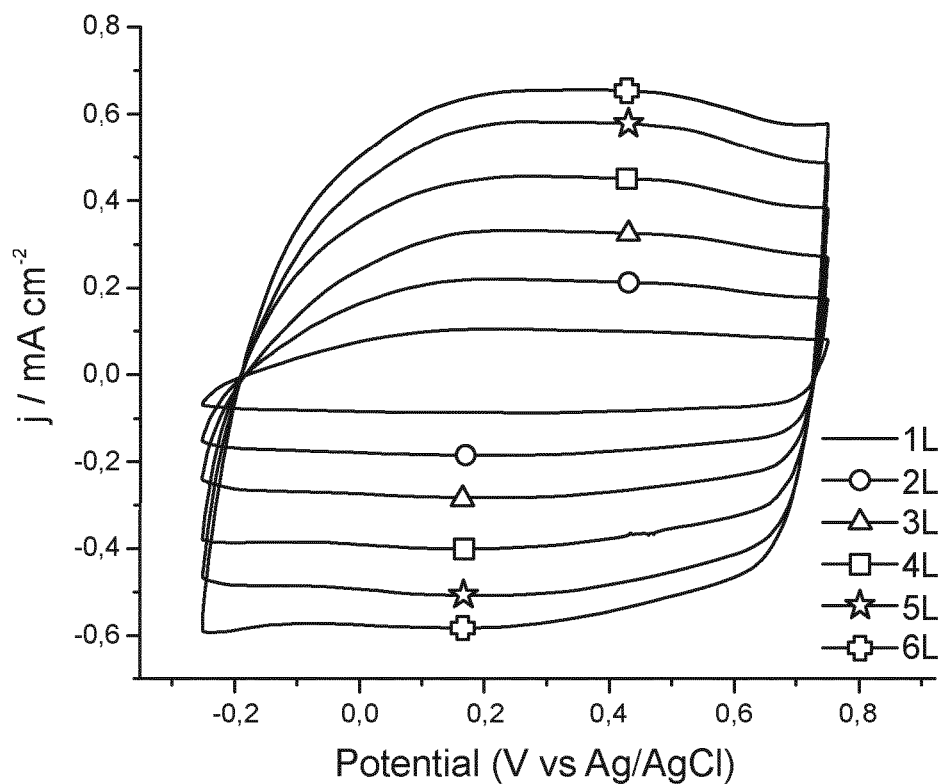
FIG. 4 illustrates Cyclic voltammograms of 1L to 6L PEDOT (in 0.1 M TBABF$_4$ in MeCN with 100 mV/s scan rate).

FIG. 4 illustrates Cyclic voltammograms of 1L to 6L PEDOT (0.1 M TBABF$_4$ in MeCN with 100 mV/s scan rate).

Figure 5:
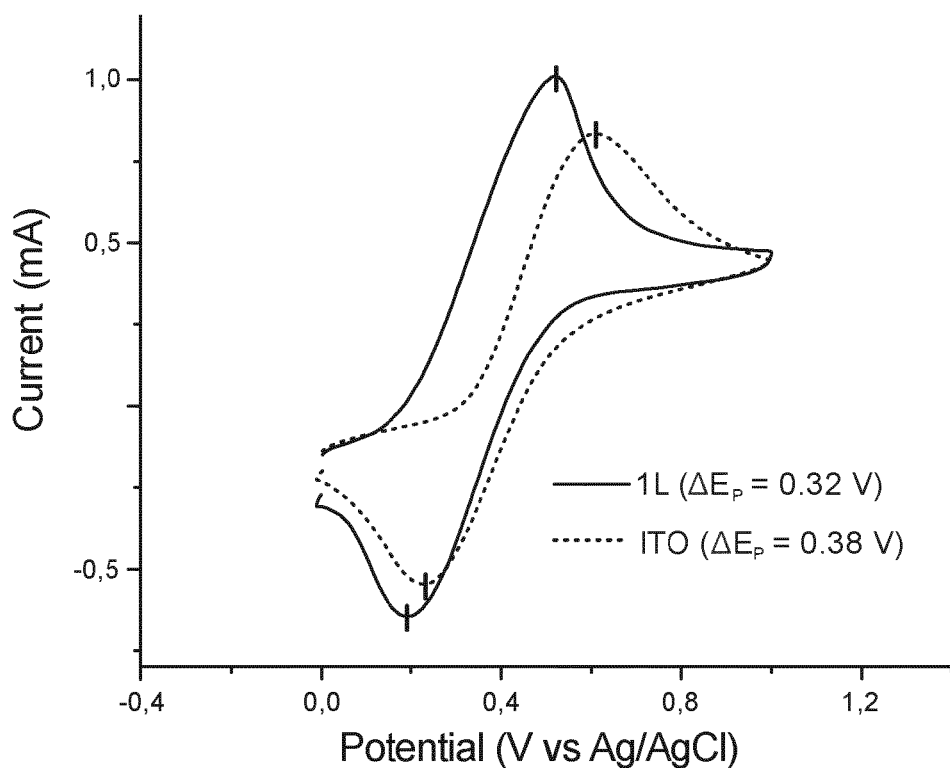
FIG. 5 illustrates Cyclic voltammograms of 1L PEDOT on glass and ITO coated glass in 6 mM Ferrocene solution with 20 mV/s scan rate.

FIG. 5 illustrates Cyclic voltammograms of 1L PEDOT on glass and ITO coated glass in 6 mM Ferrocene solution with 20 mV/s scan rate.

In FIG. 4, cyclic voltammograms of rectangular shapes indicate reversible and efficient charging-discharging processes. Table 4 shows that there is an increase in capacitance values with every layer of PEDOT film. A film of 6 layers showed 10.67 mF/cm$^2$ (areal capacitance) and 703.58 F/cm$^3$ (volumetric capacitance) capacitance values. In FIG. 5, cyclic voltammogram of a single layer of PEDOT is compared to bare ITO coated glass in 6 mM ferrocene solution. From the difference in peak potentials PEDOT required 60 mV less than the ITO coated glass. Calculated charge values for 1L PEDOT and ITO coated glass are 42.93 mC and 36.48 mC, respectively. This can be explained by the higher surface area of PEDOT in comparison to ITO coated glass. Overall the ferrocene response of 1L PEDOT is superior over ITO coated glass.

The high transparency, surface area, conductivity, and a very low surface roughness of one- and multi-layer PEDOT film makes them usable in optoelectronic devices and an alternative to ITO coated materials.

It is obvious to a person skilled in the art that with the advancement of technology, the basic idea may be implemented in various ways. The embodiments are thus not limited to the examples described above; instead they may vary within the scope of the claims.

The embodiments described hereinbefore may be used in any combination with each other. Several of the embodiments may be combined together to form a further embodiment. A method, a conducting PEDOT film, an electronic device, or a use, disclosed herein, may comprise at least one of the embodiments described hereinbefore. It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items. The term "comprising" is used in this specification to mean including the feature(s) or act(s) followed thereafter, without excluding the presence of one or more additional features or acts.

Example 2—Preparation of the PEDOT Film

The procedure described above for example 1 was followed but the 80 µl of oxidant solution was spin coated on the substrate at 2400 rpm for 20 s.

Table 5 describes the changes in roughness and sheet resistance of 1 layer PEDOT films prepared by varying first the polymerization temperatures (cell temperatures) while keeping the substrate temperature (about room temperature) and polymerization time (4 minutes) constant, and then varying the substrate temperatures while keeping the polymerization temperature (75° C.) and polymerization time (4 minutes) constant, and finally, varying the polymerization time (from 2 to 8 minutes) while keeping the polymerization temperature (75° C.) and the substrate temperature (about room temperature) constant. All the films were prepared using 80 μl of oxidant solution. The oxidant was spin coated on the substrate with a spin coating speed of 2400 rpm. The oxidant layer was dried at 90° C. for 90 s. Annealing was performed at 90° C. for 90 s. The films were washed with acetonitrile and dried under nitrogen gas stream.

TABLE 5

| Variable parameter | | Roughness average $R_a$ (nm) | Sheet resistance (Ω/□)* |
|---|---|---|---|
| Cell temperature (° C.) | 55 | 0.77 | 235.56 |
| | 65 | 0.68 | 208.18 |
| | 75 | 0.75 | 201.26 |
| | 85 | 1.13 | 224.15 |
| | 95 | 1.29 | 228.69 |
| Substrate temperature (° C.) | 35 | 2.03 | 208.35 |
| | 45 | 1.02 | 203.82 |
| | 55 | 1.07 | 206.21 |
| | 65 | 0.93 | 197.08 |
| | 75 | 0.82 | 208.35 |
| Polymerization time (min) | 2 | 1.01 | 208.45 |
| | 4 | 1.09 | 201.611 |
| | 6 | 0.78 | 210.68 |
| | 8 | 1.11 | 235.56 |

*Jandel model RM3000+ with cylindrical four point probe head was used to obtain sheet resistance values. The sheet resistance of 15 layers of PEDOT film is 4 to 6 Ω/□

Example 3—Preparation of the PEDOT Film

The procedure described above for example 1 was followed but different spinning speed, oxidant volumes, oxidant releasing time and overall spinning time was used.

Table 6 describes the changes in sheet resistance and % Transmittance of PEDOT films prepared by using different spinning speed, oxidant volumes, oxidant releasing time and overall spinning time.

TABLE 6

| No. | Spinning speed rpm | Oxidant volume μL | Oxidant releasing time s | Overall spinning time s | Sheet resistance Ω/□ | % T at 550 nm % T |
|---|---|---|---|---|---|---|
| 1 | 1800 | 60 | 25 | 90 | 125-140 | 84 |
| 2 | 1800 | 40 | 25 | 90 | 118-125 | 83 |
| 3 | 1800 | 20 | 20 | 90 | 119-122 | 83 |
| 4 | 1800 | 20 | 10 | 60 | 140-145 | n.a. |
| 5 | 1800 | 40 | 25 | 90 | 126-135 | n.a. |
| 6 | 1800 | 80 | 55 | 90 | 108-119 | n.a. |
| 7 | 1800 | 80 | 80 | 15 | 138-150 | n.a. |
| 8 | 1600 | 80 | 10 | 35 | 145-150 | n.a. |

Jandel model RM3000+ with cylindrical four point probe head was used to obtain sheet resistance values.

Example 3—Preparation of the Polymer Film Formed of Copolymer

The procedure described above for example 1 and 2 was followed but the polymer layer was formed of a copolymer, wherein one of the monomers was EDOT and the additional monomer was azulene. Both monomers were exposed simultaneously to the substrate. The parameters during the example as well as the results are discussed below in relation to Table 7.

Table 7 describes the sheet resistance, the transmittance and roughness values for films comprising a polymer layer formed of a copolymer, wherein the monomers are EDOT and azulene prepared by using different oxidants. All the films were prepared using 80 μl of oxidant solution. The oxidant was spin coated on the substrate with a spin coating speed of 2400 rpm. The oxidant layer was dried at 90° C. for 90 s. Polymerization time per layer was 4 minutes and polymerization temperature (cell temperature) was 65° C. in entries 1 and 2. Annealing was performed for all films. The films were washed two times with acetonitrile and dried under nitrogen gas stream. The substrate temperature was 55° C. in entries 1 and 2. All the sheet resistance values are measured immediately after film preparation.

TABLE 7

Sheet resistance and roughness values of 1 L COPOL films prepared with different oxidants.

| Entry | Polymer | Oxidant | Abs at 550 nm | % T at 550 nm | Sheet resistance (MΩ/□) | Roughness (nm) | |
|---|---|---|---|---|---|---|---|
| | | | | | | RMS | $R_a$ |
| 1 | COPOL (PEDOT + PAz) | CuCl$_2$ | 0.12 | 76 | 61 | 13 | 10 |
| 2 | COPOL (PEDOT + PAz) | FETOS (+ 120 mM Pyridine) | 0.18 | 66 | 0.05-0.2 | 44 | 34 |

*number of layer in entries 1-3 was one (1 L) and the oxidant concentration was 240 mM
*Jandel model RM3000+ with cylindrical four point probe head was used to obtain sheet resistance values.

Polymer layer formed of a PEDOT was also prepared by using similar procedure as described above but using Iron (III) trifluoromethanesulfonate Fe(OTF)$_3$ as the oxidant and polymerization temperature of 75° C.

TABLE 8

Electrochemical characterization of 1 L COPOL (240 mM CuCl$_2$)

| Potential range | Charge (mC) | Potential window (V) | Areal capacitance (mF/cm$^2$) | Volumetric capacitance range (F/cm$^3$) | | Thickness range (nm) | |
|---|---|---|---|---|---|---|---|
| −0.25 to 0.8 V | 1.61 | 1.05 | 1.4 | 428 | 1028 | | |
| −0.5 to 1.0 V | 3.69 | 1.5 | 2.2 | 687 | 1649 | d1 = A/k1 | d2 = A/k2 |
| −0.5 to −1.9 V | 34.86 | 1.4 | 22.0 | 6951 | 16693 | 13.2 | 31.7 |

*0.1M TBABE$_4$ (tetrabutylammonium tetrafluoroborate) in Acetonitrile is used as electrolyte solution; scan rate = 50 mV/s.

It is also possible to make polymers by layer to layer technique, by first preparing one layer of PEDOT, then one layer of PAz and this layering can even be continued. It is also possible to start by layer with PAz and the PEDOT on top, and also here continuous layering can be made.

The invention claimed is:

1. A method for producing a poly (3,4-ethylenedioxythiophene) (PEDOT) film comprising a substrate and at least one PEDOT layer on at least one surface of the substrate
   wherein the method comprises the steps of:
   a) applying a solution comprising an oxidant and a base inhibitor on at least one surface of the substrate so as to form an oxidant coating on at least one surface of the substrate,
   b) subjecting the oxidant-coated substrate formed in step a) to a polymerization step by exposing the surface(s) of the oxidant-coated substrate to 3,4-ethylenedioxythiophene (EDOT) monomer vapour at a polymerization temperature to form a PEDOT layer on the surface(s) of the oxidant-coated substrate, and
   wherein, during the polymerization step, the temperature of the oxidant-coated substrate is kept at a controlled substrate temperature and wherein the controlled substrate temperature is 2-40° C. lower than the polymerization temperature and wherein the polymerization temperature is 55-95° C. and the controlled substrate temperature is 40-70° C.

2. The method of claim 1, wherein the substrate is a non-conducting substrate.

3. The method of claim 1, wherein the method comprises the steps of:
   c) applying the solution comprising the oxidant and the base inhibitor on at least one surface of the PEDOT layer formed in step b) so as to form an oxidant coating on the at least one surface of the PEDOT layer,
   d) subjecting the oxidant-coated PEDOT layer formed in step c) to a polymerization step by exposing the surface(s) of the oxidant-coated PEDOT layer to 3,4-ethylenedioxythiophene (EDOT) monomer vapour at a polymerization temperature to form a subsequent PEDOT layer on the surface(s) of the oxidant-coated PEDOT layer,
   wherein, during the polymerization step, the temperature of the oxidant-coated PEDOT film is kept at a controlled substrate temperature and wherein the controlled substrate temperature is 2-40° C. lower than the polymerization temperature and wherein the polymerization temperature is 55-95° C. and the controlled substrate temperature is 40-70° C.

4. A method for producing a polymer film formed of a copolymer wherein one of the monomers of the copolymer is (3,4-ethylenedioxythiophene) (EDOT), comprising a substrate and at least one polymer layer formed of a copolymer wherein one of the monomers of the copolymer is EDOT monomer on at least one surface of the substrate wherein the method comprises the steps of:
   a) applying a solution comprising an oxidant and a base inhibitor on at least one surface of the substrate so as to form an oxidant coating on at least one surface of the substrate,
   b) subjecting the oxidant-coated substrate formed in step a) to a polymerization step by exposing the surface(s) of the oxidant-coated substrate to a vapour of at least two different monomers, wherein one of the monomers is EDOT monomer, at a polymerization temperature to form a polymer layer on the surface(s) of the oxidant-coated substrate, and
   wherein, during the polymerization step, the temperature of the oxidant-coated substrate is kept at a controlled substrate temperature and wherein the controlled substrate temperature is 2-40° C. lower than the polymerization temperature and wherein the polymerization temperature is 55-95° C. and the controlled substrate temperature is 40-70° C.

5. The method of claim 4, wherein the method comprises the steps of:
   c) applying the solution comprising the oxidant and the base inhibitor on at least one surface of the polymer layer formed in step b) so as to form an oxidant coating on the at least one surface of the polymer layer,
   d) subjecting the oxidant-coated polymer layer formed in step c) to a polymerization step by exposing the surface(s) of the oxidant-coated polymer layer to a vapour of at least two different monomers, wherein one of the monomers is EDOT at a polymerization temperature to form a subsequent polymer layer on the surface(s) of the oxidant-coated polymer layer,
   wherein, during the polymerization step, the temperature of the oxidant-coated polymer film is kept at a controlled substrate temperature and wherein the controlled substrate temperature is 2-40° C. lower than the polymerization temperature and wherein the polymerization temperature is 55-95° C. and the controlled substrate temperature is 40-70° C.

6. The method of claim 3, wherein the method comprises repeating step c) and step d) at least once.

7. The method of claim 4, wherein vapour of at least two different monomers comprises or consists of 3,4-ethylenedioxythiophene (EDOT) and at least one further monomer selected from a group consisting of azulene, pyrrole, aniline, thiophene, and phenylene.

8. The method of claim 1, wherein the temperature of the oxidant-coated substrate is kept at a controlled substrate temperature during the polymerization step, and the controlled substrate temperature is 2-30° C. lower than the polymerization temperature.

9. The method of claim 1, wherein the method is vapour phase polymerization (VPP).

10. The method of claim 1, wherein the polymerization temperature 60-85° C. and the controlled substrate temperature is 45-70° C.

11. The method of claim 1, wherein the method is carried out as a batch process or a continuous process.

12. The method of claim 1, wherein the temperature of the oxidant-coated substrate and/or the oxidant-coated PEDOT film or the oxidant-coated substrate and/or the oxidant-coated polymer film formed of a copolymer is kept at the controlled substrate temperature during the entire polymerization step.

13. The method of claim 1, wherein the polymerization step comprises two sequential processing periods wherein the substrate is kept at the controlled substrate temperature and wherein substrate is not kept at the controlled substrate temperature, and wherein the temperature of the oxidant-coated substrate and/or the oxidant-coated PEDOT film or the oxidant-coated substrate and/or the oxidant-coated polymer film formed of a copolymer is kept at the controlled substrate temperature throughout one of the processing periods.

14. The method of claim 1, wherein the polymerization step comprises three sequential processing periods wherein the substrate is kept at the controlled substrate temperature and wherein substrate is not kept at the controlled substrate temperature, and wherein the temperature of the oxidant-coated substrate and/or the oxidant-coated PEDOT film or the oxidant-coated substrate and/or the oxidant-coated polymer film formed of a copolymer is kept at the controlled substrate temperature throughout the middle processing period.

15. The method of claim 1, wherein the method comprises the step of cleaning the substrate before step a).

16. The method of claim 1, wherein the solution comprising the oxidant and the base inhibitor is spin-coated on at least one surface of the substrate in step a) and/or on at least one surface of the PEDOT layer or the polymer layer formed of a copolymer formed in step c), or on at least one surface of the substrate in step a) and/or on the polymer layer formed of a copolymer formed in step c).

17. The method of claim 1, wherein the method comprises cleaning, drying and/or heating the oxidant-coated substrate before step b), and/or the PEDOT polymer film from step c) before step d) and/or the polymer film formed of a copolymer from step c) before step d).

18. The method of claim 1, wherein the method comprises the step of annealing the PEDOT film or the polymer film formed of a copolymer at a temperature of 50-100° C. after polymerization and optionally washing and drying the annealed PEDOT film or the polymer film formed of a copolymer, respectively.

19. The method of claim 3, wherein the method comprises the step of cleaning the PEDOT polymer film or the polymer film formed of a copolymer received from step b) before step c).

20. The method of claim 1, wherein the duration of the polymerization step is 1-20 minutes.

21. The method of claim 1, wherein the duration of the polymerization step processing period wherein the temperature of the oxidant-coated substrate and/or the oxidant-coated PEDOT film or the temperature of the oxidant-coated substrate and/or the polymer film formed of a copolymer is kept at a controlled substrate temperature is 20-80% of the duration of the polymerization step.

22. The method of claim 1, wherein the non-conductive substrate is glass or polyethylene terephthalate (PET).

23. The method of claim 1, wherein the oxidant is Iron(III) p-toluenesulfonate hexahydrate (FETOS).

24. The method of claim 1, wherein the base inhibitor is pyridine.

* * * * *